United States Patent
Dai et al.

(10) Patent No.: US 11,675,281 B2
(45) Date of Patent: Jun. 13, 2023

(54) METHODS OF ALIGNMENT, OVERLAY, CONFIGURATION OF MARKS, MANUFACTURING OF PATTERNING DEVICES AND PATTERNING THE MARKS

(71) Applicant: ASML NETHERLANDS B.V., Veldhoven (NL)

(72) Inventors: Jin Dai, Veldhoven (NL); Sanjaysingh Lalbahadoersing, Helmond (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/626,896

(22) PCT Filed: Jun. 15, 2020

(86) PCT No.: PCT/EP2020/066478
§ 371 (c)(1),
(2) Date: Jan. 13, 2022

(87) PCT Pub. No.: WO2021/008794
PCT Pub. Date: Jan. 21, 2021

(65) Prior Publication Data
US 2022/0252994 A1 Aug. 11, 2022

(30) Foreign Application Priority Data

Jul. 15, 2019 (EP) .................................. 19186248
Jul. 18, 2019 (EP) .................................. 19186925

(51) Int. Cl.
*G03F 9/00* (2006.01)
(52) U.S. Cl.
CPC .......... *G03F 9/7088* (2013.01); *G03F 9/7076* (2013.01)

(58) Field of Classification Search
CPC .... G03F 9/7076; G03F 9/7088; G03F 9/7046; G03F 9/7049; G03F 7/70616
See application file for complete search history.

(56) References Cited

U.S. PATENT DOCUMENTS

| 6,952,253 | B2 | 10/2005 | Lof et al. |
| 11,086,232 | B2* | 8/2021 | Sciacca ................ G03F 9/7076 |
| 2009/0310113 | A1 | 12/2009 | Musa et al. |

FOREIGN PATENT DOCUMENTS

| EP | 1628164 | 2/2006 |
| EP | 1788451 | 5/2007 |

(Continued)

OTHER PUBLICATIONS

International Search Report and Written Opinion issued in corresponding PCT Patent Application No. PCT/EP2020/066478, dated Oct. 2, 2020.

*Primary Examiner* — Peter B Kim
(74) *Attorney, Agent, or Firm* — Pillsbury Winthrop Shaw Pittman, LLP (57) ABSTRACT

A resonant amplitude grating mark has a periodic structure configured to scatter radiation incident on the mark. The scattering is mainly by coupling of the incident radiation to a waveguiding mode in the periodic structure. The effective refractive indexes and lengths of portions of the periodic structure are configured to provide an optical path length of the unit cell in the direction of periodicity that essentially equals an integer multiple of a wavelength present in the radiation. The effective refractive indexes and lengths of the portions are also configured to provide an optical path length of the second portion in the direction of periodicity that is selected from 0.30 to 0.49 of the wavelength present in the spectrum of the radiation.

13 Claims, 6 Drawing Sheets

(56) References Cited

FOREIGN PATENT DOCUMENTS

WO         9949504     9/1999
WO      2019081091     5/2019

* cited by examiner

METHODS OF ALIGNMENT, OVERLAY, CONFIGURATION OF MARKS, MANUFACTURING OF PATTERNING DEVICES AND PATTERNING THE MARKS

CROSS-REFERENCE TO RELATED APPLICATIONS

This application is the U.S. national phase entry of PCT Patent Application No. PCT/EP2020/066478 which was filed on Jun. 15, 2020, which claims the benefit of priority of European Patent Application No. 19186248.1 which was filed on Jul. 15, 2019 and of European Patent Application No. 19186925.4 which was filed on 18 Jul. 2019, each of which is incorporated herein in its entirety by reference.

FIELD

The present disclosure relates to a mark, an overlay target, and associated methods of alignment and determining an overlay error usable, for example, in the manufacture of devices by lithographic techniques

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-k1 lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and k1 is an empirical resolution factor. In general, the smaller k1 the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield. So-called overlay should, in general, be achieved within a few tens of nanometers in today's sub-micron semiconductor devices, down to a few nanometers in the most critical layers.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of electromagnetic radiation onto a target and measure one or more properties of the scattered electromagnetic radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Conventional binary phase grating marks rely on the interference between the diffracted light from the top of the lines and bottom of the spaces. The diffraction of light is highly dependent on the grating depth. The interference between + and − diffraction orders are detected by an alignment sensor to determine the alignment position. For an ideal mark without any asymmetries, the Alignment Position Deviation (APD) should theoretically be 0. However, due to the imperfections in processes, e.g. etching, chemical-mechanical polishing (CMP), deposition, etc., the mark can be deformed in many different ways. Typical mark deformation can be simplified and categorized in three main asymmetry types, including Floor Tilt (FT), Side Wall Angle (SWA), and Top Tilt (TT). The mark depth can also be different from nominal values due to process. When one or many of these asymmetries appears in the printed mark it will lead to an alignment error, i.e., APD. Due to the interference nature of a phase grating, the impacts of asymmetries on APD also depends strongly on the mark depth.

Overlay targets that are used to measure overlay error also suffer from the same problems of deformation. This can lead to inaccuracies in the measured overlay error.

International patent publication number WO2019081091A1, which is incorporated herein by reference in its entirety, described these problems and disclosed a solution comprising resonant amplitude mark. A mark is formed on a planar substrate, the mark comprising a periodic structure configured to scatter radiation incident on a surface plane of the alignment mark, the surface plane parallel to the substrate's plane, the scattering mainly by excitation of a resonant mode in the periodic structure parallel to the surface plane. A problem with that approach it that it is restricted to design rules based on resonance.

SUMMARY

It is desirable to have marks (typically alignment marks and overlay targets) that are less sensitive to mark asymmetry rising from process-induced deformation over a wide design-rule margin. It is further desirable to provide methods of: alignment, overlay measurement, configuring of marks used in said alignment and overlay measurements, manufacturing of patterning devices comprising said less sensitive marks, and providing said less sensitive marks to planar substrates. It is further desirable to have a metrology system configured to perform the methods of alignment and overlay measurement, and tools, such a lithographic apparatus or a standalone metrology tool comprising said metrology system.

According to a first aspect of the present invention, there is provided a method of alignment comprising the steps: providing an alignment mark formed on or in a planar substrate, the mark comprising a periodic structure, wherein the periodic structure has a repeated unit cell divided into adjacent first and second portions along a direction of periodicity, the first portion having a first effective refractive index and a first length along the direction of periodicity, the second portion having a second effective refractive index, which is lower over its optical path compared to the first effective refractive index, and a second length along the direction of periodicity; illuminating the alignment mark with radiation having a predetermined wavelength, wherein the effective refractive indexes and lengths of the portions of the alignment mark are configured to provide: a) an optical path length of the unit cell in the direction of periodicity that equals an integer multiple of the predetermined wavelength, and b) an optical path length of the second portion in the direction of periodicity of 0.35 to 0.45 of the predetermined wavelength, such that scattering occurs mainly by excitation of a waveguiding mode in the periodic structure; detecting radiation scattered by the alignment mark arising from the illumination; and determining a position of the alignment mark using the detected radiation.

According to a second aspect of the present invention, there is provided a method of alignment, comprising the steps: providing an alignment mark formed on or in a planar substrate, the mark comprising a periodic structure, wherein the periodic structure has a repeated unit cell divided into adjacent first and second portions along a direction of periodicity, the first portion having a first effective refractive index and a first length along the direction of periodicity, the second portion having a second effective refractive index, which is lower over its optical path compared to the first effective refractive index, and a second length along the direction of periodicity; illuminating the alignment mark with broadband radiation comprising a predetermined wavelength, wherein the effective refractive indexes and lengths of the portions of the alignment mark are configured to provide: a) an optical path length of the unit cell in the direction of periodicity that equals an integer multiple of the predetermined wavelength, and b) an optical path length of the second portion in the direction of periodicity that is from 0.35 to 0.45 of the predetermined wavelength, such that scattering of the predetermined wavelength occurs mainly by excitation of a waveguiding mode in the periodic structure; filtering the radiation scattered by the alignment mark arising from the illumination to select the wavelength corresponding to excitation of the waveguiding mode in the periodic structure parallel to the surface plane; detecting the filtered radiation; and determining a position of the alignment mark using the detected radiation.

According to a third aspect of the present invention, there is provided a method of overlay measurement, the method comprising: providing an overlay mark formed on or in a planar substrate, the overlay mark comprising a lower mark overlaid with an upper mark having the same pitch as the lower mark, the lower mark comprising a periodic structure, wherein the periodic structure has a repeated unit cell divided into adjacent first and second portions along a direction of periodicity, the first portion having a first effective refractive index and a first length along the direction of periodicity, the second portion having a second effective refractive index, which is lower over its optical path compared to the first effective refractive index, and a second length along the direction of periodicity; illuminating the overlay mark with radiation having a predetermined wavelength, wherein the effective refractive indexes and lengths of the portions of the lower mark are configured to provide: a) an optical path length of the unit cell in the direction of periodicity that equals an integer multiple of the predetermined wavelength, and b) an optical path length of the second portion in the direction of periodicity that is within a range of 0.35 to 0.45 of the predetermined wavelength, such that scattering occurs mainly by excitation of a waveguiding mode in the periodic structure; detecting the radiation scattered by the overlay mark arising from the illumination; and determining overlay at the position of the overlay mark using the detected radiation.

According to a fourth aspect of the present invention, there is provided a method of configuring a mark on or in a planar substrate having a periodic structure configured to scatter radiation incident on the mark while being subject to an alignment or overlay measurement on the planar substrate, the method comprising: obtaining a wavelength of the radiation incident on the mark; and configuring the periodic structure based on the excitation of a waveguiding mode of the periodic structure parallel to the surface plane of the planar substrate when illuminated by the incident radiation at the wavelength.

According to a fifth aspect of the present invention, there is provided a method for manufacturing a patterning device used in providing a mark comprising a periodic structure to a planar substrate, the method comprising: obtaining a wavelength of radiation used in illuminating the planar substrate while being subject to an alignment or overlay measurement; configuring the periodic structure such that when provided to the planar substrate it provides: a) scattering of incident radiation while being subject to the alignment or overlay measurement; and b) coupling of the incident radiation at the wavelength to a waveguiding mode of the periodic structure parallel to the surface plane of the substrate; and providing the configured mark to the patterning device during a process of manufacturing of the patterning device.

According to a sixth aspect of the present invention, there is provided a method for providing a planar substrate with a mark having a periodic structure configured to scatter radiation incident on the mark while being subject to an alignment or overlay measurement, the method comprising: obtaining a patterning device manufactured according to the method of the fifth aspect of the invention; obtaining the planar substrate; and using the patterning device and the planar substrate in a lithographic process to provide the mark to the planar substrate.

According to a seventh aspect of the present invention, there is provided a metrology system configured to perform the method of any of the first three aspects of the invention.

According to an eight aspect of the present invention, there is provided a lithographic apparatus or metrology tool comprising the metrology system of the seventh aspect of the invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
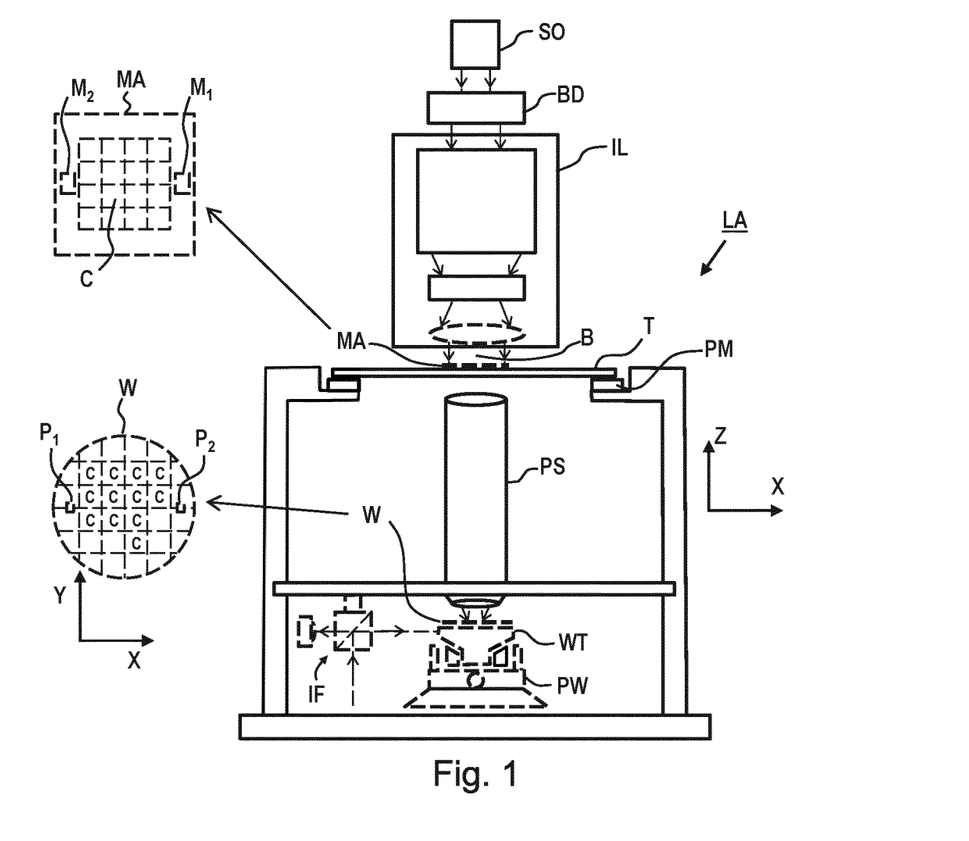
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g., a mask table) T constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system(e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT publication No. WO99-49504, which are incorporated herein by reference.

The lithographic apparatus LA may also be of a type having two (dual stage) or more substrate tables WT and, for example, two or more support structure T (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table T), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Embodiments of the present invention provide novel marks made as binary gratings. A general framework of mark design insensitive to asymmetries is provided. A general framework of mark design insensitive to depth variation is also provided. Only one single wavelength is required with the novel mark design to mitigate the effects of process-induced mark asymmetry. Furthermore, alignment signal strength (Wafer Quality WQ) may be tunable simply by adjusting the marks' pitch. The marks simplify reference wafer manufacturing, providing "golden" reference wafers for wafer-to-wafer error correction, since they are insensitive to process-induced mark asymmetry.

Embodiments provide a novel of binary mark design that is insensitive to most type of asymmetries (FT, SWA) over a wide design-rule margin. It is insensitive to depth variation and therefore to process fluctuations for any asymmetry (FT, SWA, TT).

Figure 4:
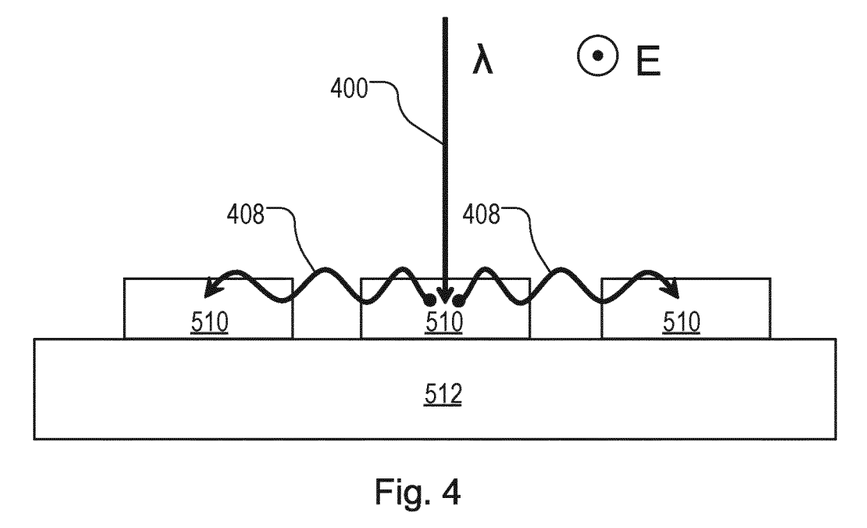
FIG. 4 depicts a grating in the resonance regime.
Figure 5:
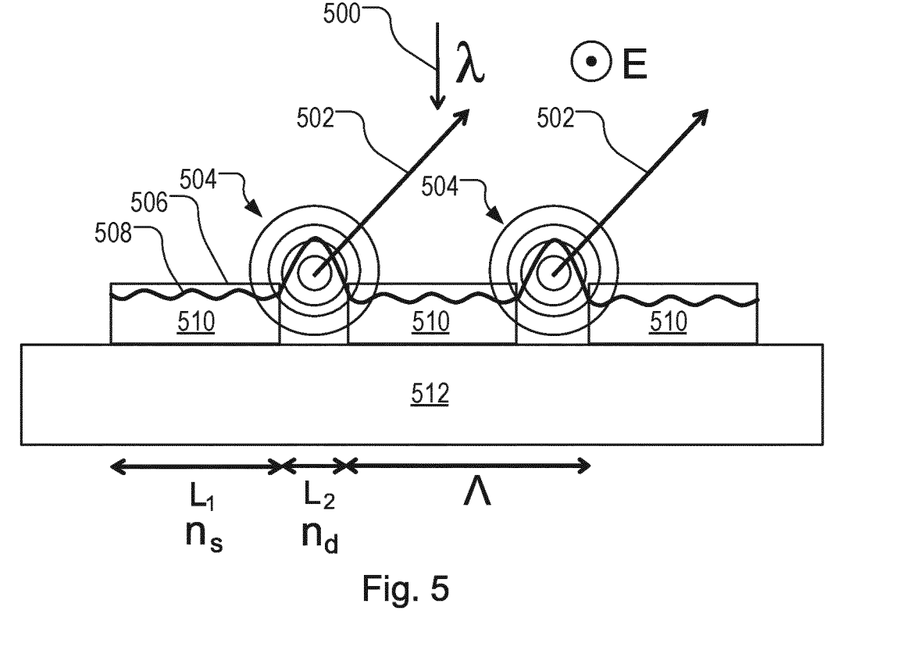
FIG. 5 depicts a resonant amplitude mark (RAM)

Before considering the novel mark, the conventional phase grating will be described (FIG. 2) and the principle of amplitude gratings (FIG. 3) and generation of resonance (FIG. 4) will be described along with the mark disclosed in WO2019081091A1 (FIG. 5).

Figure 2:
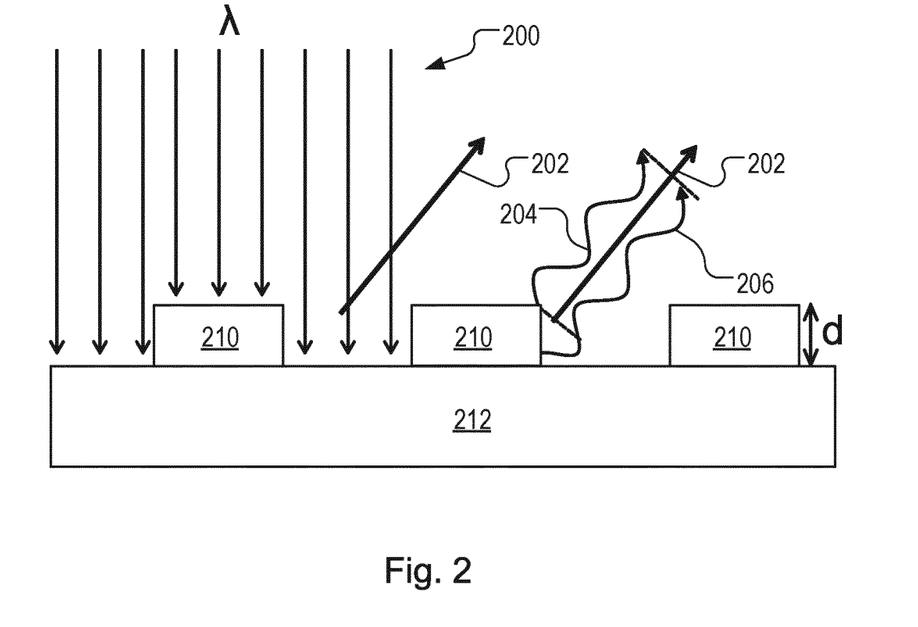
FIG. 2 depicts diffraction by a conventional phase grating.

FIG. 2 depicts diffraction by a conventional phase grating. Radiation 200 of wavelength λ illuminates the periodic structure 210 formed on a planar substrate 212 which in this example is a grating shown in cross-section. The gap between the ridges 210 forms a trench of depth d extending down to the substrate 212. This (d) is the mark depth. Interference between scattered radiation 204, 206 reflected at the top and at the bottom of the grating 210 respectively is constructive for an optimal thickness d to produce scattered radiation 202. Diffraction thus occurs via modulation of the phase of the reflected wave. The grating introduces a periodic modulation of the wavefront.

Figure 3:
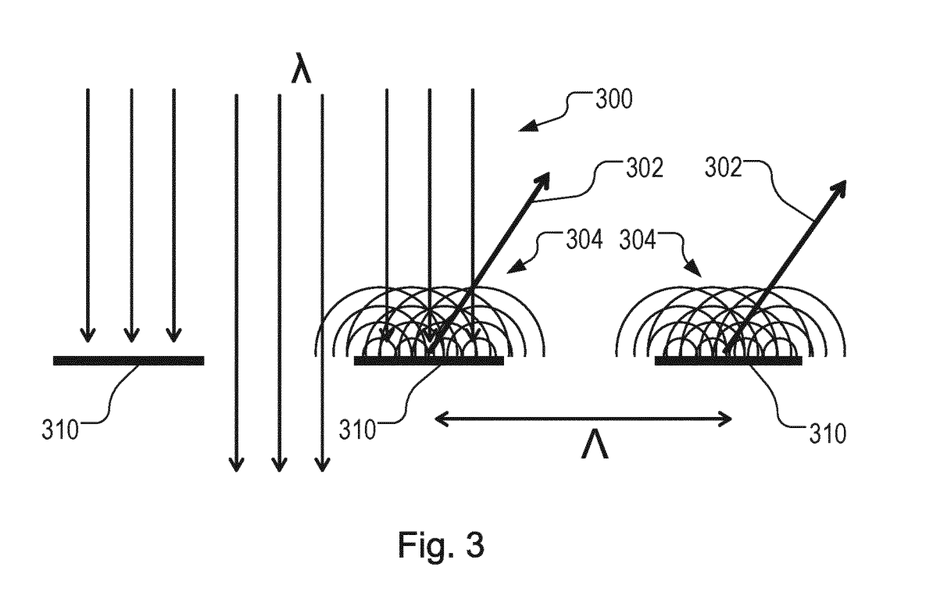
FIG. 3 depicts diffraction by an amplitude grating.

FIG. 3 depicts diffraction by an amplitude grating. Radiation 300 of wavelength λ illuminates the grating 310. Radiation 302 diffracted by a grating with periodic apertures in a reflective film depends only on the period ∧. The reflective film is equivalent to a set of point sources 304. In contrast to the phase grating, diffraction occurs via modulation of the amplitude of the reflected wave, rather than the phase. In common with the phase grating, the amplitude grating introduces a periodic modulation of the wavefront.

FIG. 4 depicts a grating in the resonance regime. Radiation 400 of wavelength λ illuminates the grating 510. The incoming radiation 400 resonantly excites to counter-propagating waves 408 in the grating plane. The grating itself introduces the momentum required.

FIG. 5 depicts a resonant amplitude mark (RAM), in accordance with the disclosure of WO2019081091A1. A mark is formed on a planar substrate 512. The mark has a periodic structure configured to scatter radiation 502 of wavelength λ incident 500 on a surface plane 506 of the alignment mark. The surface plane 506 is parallel to the substrate's plane. The scattering is mainly by excitation of a resonant mode 508 in the periodic structure parallel to the surface plane.

The periodic structure has a repeated unit cell divided into adjacent first 510 and second 504 portions along a direction of periodicity (left-to-right in the cross-section of FIG. 5).

The first portion 510 has a first effective refractive index ($n_s$) and a first length ($L_1$) along the direction of periodicity. The second portion 504 has a second effective refractive index ($n_d$), which is lower over its optical path compared to the first effective refractive index, and a second length ($L_2$) along the direction of periodicity.

The effective refractive indexes ($n_s$, $n_d$) and lengths ($L_1$, $L_2$) of the portions are configured to provide an optical path length of the unit cell in the direction of periodicity ($n_sL_1+n_dL_2$) that equals an integer multiple of a wavelength present in the spectrum of the radiation (mλ).

The wavelength of the incident radiation may be predetermined such that it matches the resonance design rules. Alternatively, broadband radiation may be incident on a marker and an alignment sensor frequency filter may be tuned afterwards to select the resonant mode wavelength.

The effective refractive indexes ($n_s$, $n_d$) and lengths ($L_1$, $L_2$) of the portions are also configured to provide an optical path length of the second portion in the direction of periodicity ($n_dL_2$) that is equal to half of an integer multiple of the wavelength present in the spectrum of the radiation (kλ/2). These are conditions matching the radiation wavelength to the grating material boundary conditions so as to support a resonance.

In this example, the optical path length of the second portion in the direction of periodicity ($n_dL_2$) is equal to half of the wavelength present in the spectrum of the radiation (λ/2), therefore there is only one antinode of the resonant mode in the second portion 504, i.e. k=1. When k>1, there are an odd number of antinodes, but an even number of antinodes cancel out, leaving just one antinode that contributes to the scattering, but with reduced efficiency.

The mark is formed on a planar substrate such as a wafer W, as depicted as $P_1$ and $P_2$ in FIG. 1.

The radiation diffracted by the mark does not contain information regarding the mark outline, but only about the mark position on the wafer. The mark may be referred to as a Resonant Amplitude Mark (RAM). The terminology has been chosen to highlight the different working principle of such RAM with respect to traditional alignment marks based on phase grating (as described with reference to FIG. 2). "Mark" and "grating" may be used interchangeably. The grating may be a 1-dimensional (1-D) grating, as described with reference to the example of FIG. 5, but the invention is not limited to 1-D gratings. It may be applied to 2-D gratings with the effective refractive indices and lengths in both directions of periodicity configured to support a resonance.

In this mark design, radiation coming from the alignment sensor excites two counter-propagating waves in the grating plane. These two waves form a so called "standing wave", i.e. a resonant mode in the grating plane. As described with reference to FIG. 4, these two counter-propagating waves do not propagate through the mark depth, but remain at the mark surface, and therefore are not influenced by the mark depth.

This resonant mode effectively leaks light into grating orders, as any other type of mark, and can be captured in the very same way as for conventional marks, and therefore no new sensor design is required. In fact, the sensor will not be able to discern if the light comes from a RAM or a conventional mark, with the advantage that light coming from a RAM doesn't contain information about the mark outline, but only about the mark position, since the resonant mode lies in the grating plane. Effectively, this mark behaves as an amplitude mark, in the sense that the light diffracted in the grating orders comes from point sources localized on the grating surface in a periodic fashion, whose radiation properties don't depend on the mark depth. This is similar to the scenario with periodic slits opened in a reflective opaque film, as described with reference to FIG. 3.

With the appropriate design, this makes the mark much less sensitive to the presence of layer stacks below it, and it can be also be used as overlay target (see FIG. 17 of WO2019081091A) or in mark stacking (see FIG. 16 of WO2019081091A).

For configuration of the of the RAM, it is desirable to have efficient coupling to the resonant mode and efficient leaking of the mode in the sensor plane.

These are provided by using the following design rules:

The optical path of the grating unit cell equals an integer multiple of the wavelength:

$$n_sL_1+n_dL_2=m\lambda \qquad (1)$$

and the optical path of the low index material (space) equals half the wavelength:

$$n_dL_2=k\lambda/2, \qquad (2)$$

where $L_1+L_2=\wedge$ (pitch) and k is an integer, preferably k=1. From these two simple design rules, different pitches can be used for a specific color, accordingly with the sensor specification (numerical aperture, NA). Therefore, for a fixed wavelength λ, an increase in the mark pitch ∧ would result in a larger duty cycle.

Figure 6:
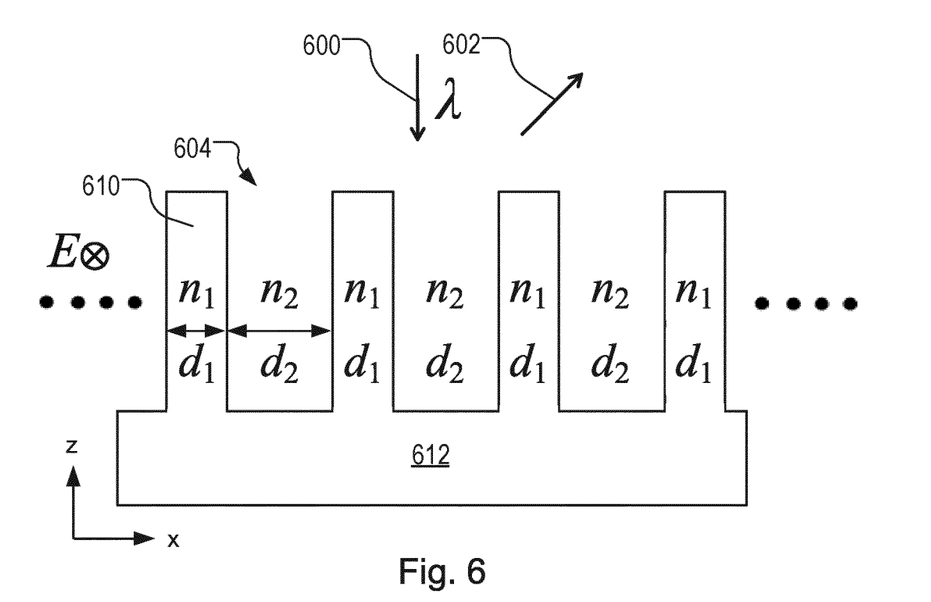
FIG. 6 depicts a guided mode mark (GMM), in accordance with an embodiment of the present invention.

In embodiments of the present invention, the diffraction similarly mainly happens at the grating top interface with very little light diffracted from the grating bottom interface. FIG. 6 depicts a guided mode mark (GMM) as a 1-dimensional photonic crystal for defining the nominal design rule.

With reference to FIG. 6, the k vector in air along the x direction is $$k_2 = n_2\frac{\omega}{c}.$$

The k vector in silicon along the x direction is $$k_1 = n_1 \frac{\omega}{c}.$$

The period of the 1D photonic crystal is $d = d_1 + d_2$.
The dispersion relation of 1D photonic crystal is $$k_x(\omega) \cdot d = \arccos\left\{\frac{1}{2} \cdot \left[2\cos k_1 d_1 \cos k_2 d_2 - \left(\frac{k_2}{k_1} + \frac{k_1}{k_2}\right)\sin k_1 d_1 \sin k_2 d_2\right]\right\}.$$

Solving for the eigen mode with $k_1 = 0$ and $$d_2 = \frac{\lambda}{2n_2}$$

we get the nominal design rule:

$$d_2 = \frac{\lambda}{2n_2} \quad (3)$$

$$d_1 = \frac{2m-1}{2n_1}\lambda; m = 1, 2, 3 \ldots. \quad (4)$$

Next we change the nomenclature to match that of equations (1) and (2).

In the portion that has a lower effective refractive index (e.g. air): $d_2$ becomes $L_2$ and $n_2$ becomes $n_d$.

In the portion that has a higher effective refractive index (e.g. Si): $d_1$ becomes $L_1$ and $n_1$ becomes $n_s$.

Therefore, equating λ with λ (in italics) and m with m (in italics), $$d_2 = \frac{\lambda}{2n_2} \text{ and } d_1 = \frac{2m-1}{2n_1}\lambda; m = 1, 2, 3 \ldots$$

becomes $$L_2 = \frac{\lambda}{2n_d} \text{ and } L_1 = \frac{2m-1}{2n_s}\lambda; m = 1, 2, 3 \ldots$$

Therefore, $$n_d L_2 = \frac{\lambda}{2}$$

This is the same design rule as equation (2).
Furthermore, $$n_s L_1 = (2m-1)\frac{\lambda}{2}; m = 1, 2, 3 \ldots$$

Adding $$n_d L_2 = \frac{\lambda}{2}$$

to both sides:

$$n_s L_1 + n_d L_2 = (2m-1)\frac{\lambda}{2} + \frac{\lambda}{2}; m = 1, 2, 3 \ldots$$

$$n_s L_1 + n_d L_2 = (2m-1+1)\frac{\lambda}{2}; m = 1, 2, 3 \ldots$$

$$n_s L_1 + n_d L_2 = m\lambda; m = 1, 2, 3 \ldots$$

This is the same design rule as equation (1). Therefore, the waveguide theory framework leads to the same nominal design rule (equations (3) and (4)) as the resonant mode approach disclosed in WO2019081091A1 (equations (1) and (2)). However, using waveguide theory it has revealed that design rules for such marks are no longer restricted to the nominal design rules based on resonance.

FIG. 6 depicts a guided mode mark (GMM), in accordance with the embodiments of the present invention. A mark is formed on a planar substrate 612. The mark has a periodic structure configured to scatter radiation 602 of wavelength λ incident 600 on the alignment mark. The scattering is mainly by coupling of the incident radiation to a waveguiding mode in the periodic structure.

The periodic structure has a repeated unit cell divided into adjacent first 610 and second 604 portions along a direction of periodicity (the x-direction; left-to-right in the cross-section of FIG. 6).

The first portion 610 has a first effective refractive index ($n_1$) and a first length ($d_1$) along the direction of periodicity. The second portion 604 has a second effective refractive index ($n_2$), which is lower over its optical path compared to the first effective refractive index, and a second length ($d_2$) along the direction of periodicity.

The effective refractive indexes ($n_1$, $n_2$) and lengths ($d_1$, $d_2$) of the portions are configured to provide an optical path length of the unit cell in the direction of periodicity ($n_1 d_1 + n_1 d_1$) that equals an integer multiple of a wavelength present in the spectrum of the radiation (mλ).

The wavelength of the incident radiation may be predetermined such that it matches the waveguide theory design rules. Alternatively, broadband radiation may be incident on a marker and an alignment sensor frequency filter may be tuned afterwards to select a wavelength associated with a desired waveguiding mode.

The effective refractive indexes ($n_1$, $n_2$) and lengths ($d_1$, $d_2$) of the portions are also configured to provide an optical path length of the second portion in the direction of periodicity ($n_2 d_2$) that is preferably equal to from 0.30 to 0.49 (more preferably from 0.35 to 0.45) of the wavelength present in the spectrum of the radiation. These are conditions matching the radiation wavelength to the grating material boundary conditions so as to support generation of a waveguiding mode The mark is formed on a planar substrate such as a wafer W, as depicted as $P_1$ and $P_2$ in FIG. 1.

The radiation diffracted by the mark does not contain information regarding the mark outline, but only about the mark position on the wafer. The mark may be referred to as a Guided Mode Mark (GMM). The terminology has been chosen to highlight the different working principle of such GMM with respect to traditional alignment marks based on phase grating (as described with reference to FIG. 2) and the RAM described with reference to FIG. 5. "Mark" and "grating" may be used interchangeably. The grating may be a 1-dimensional (1-D) grating, as described with reference to the example of FIG. 6, but the invention is not limited to 1-D gratings. It may be applied to 2-D gratings with the effective refractive indices and lengths in both directions of periodicity configured to support a resonance.

With the appropriate design, this makes the mark much less sensitive to the presence of layer stacks below it, and it can be also be used as overlay target (see FIG. 17 of WO2019081091A) or in mark stacking (see FIG. 16 of WO2019081091A).

Figure 7:
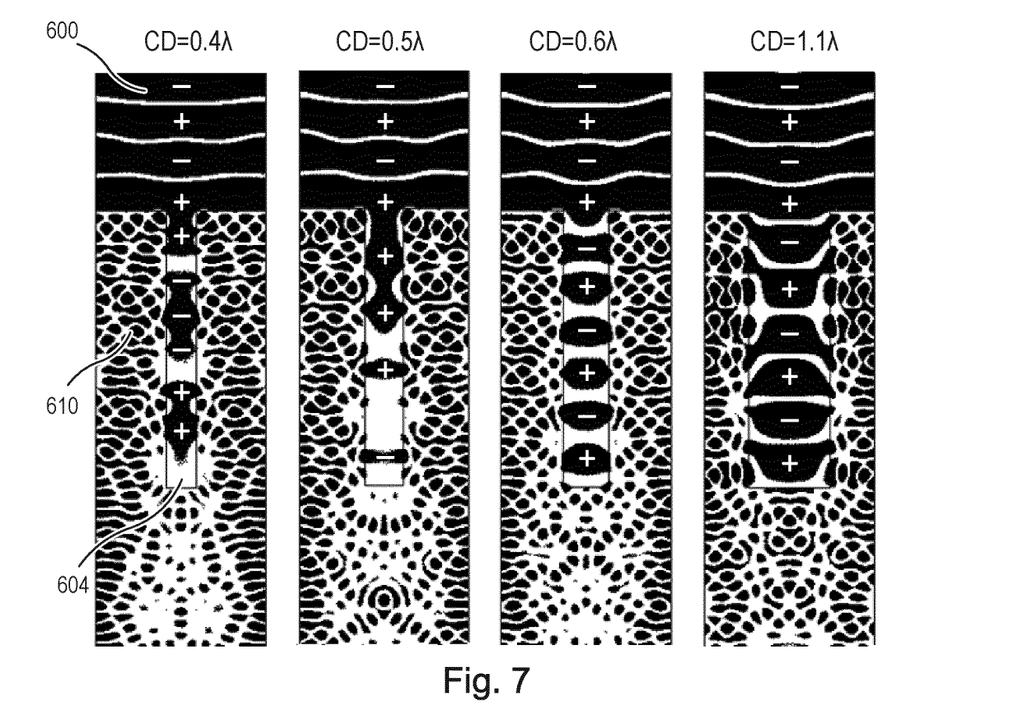
FIG. 7 depicts field distributions for a single trench for each of four different critical dimensions.

Once the nominal design rules are met, the light will be mainly coupled to the waveguiding mode mainly confined and propagated inside the silicon ridges and coupling evanescently with its neighboring silicon ridge through the trench (see the field distribution in FIG. 7 for CD=0.5*λ, where CD is the width of the air trench). As a result, FT will have the least impact on the APD. The SWA slightly affect the guided mode, only for unrealistic large mark depth. The TT is on the grating top interface which will affect the coupling of light into the waveguiding modes, manifests mainly as a general offset. Since in all the three type of asymmetries, the diffraction mainly happens at the grating top interface, the APD results by asymmetries are less dependent on mark depths comparing to traditional mark types.

However, surprisingly, using the waveguide theory framework, for the CD=0.4*λ case, we also observe a small APD in the simulations. We can see from the field distribution that the light can still be coupled to the waveguide mode but not as well as CD=0.5*λ. It indicates that the design rules disclosed in WO2019081091A1 and represented by equations (1) to (4) do not need to be met exactly. In this case, a very small portion of light is propagating in the trench but with a small effective mode index. The geometrical asymmetries will introduce less phase asymmetries due to the small effective mode index. The small effective mode index effect leads to the small APDs.

Another effect which also contributes to the small APD for FT is the small CD effect. In this mark type the duty cycle (space:line) is less than 50%. As a result, same degree of mark asymmetries will induce smaller shifts in center of gravity of the mark. This effect applies to both s- and p-polarization.

FIG. 7 depicts field distributions for a single trench for each of four different critical dimensions (CD), where CD is the width of the air trench. "−" represents a negative value of the electric field. "+" represents a positive value of the electric field. Either side of and below the trench, the black patterns represent alternating negative and positive electric field values in the silicon.

Figure 8:
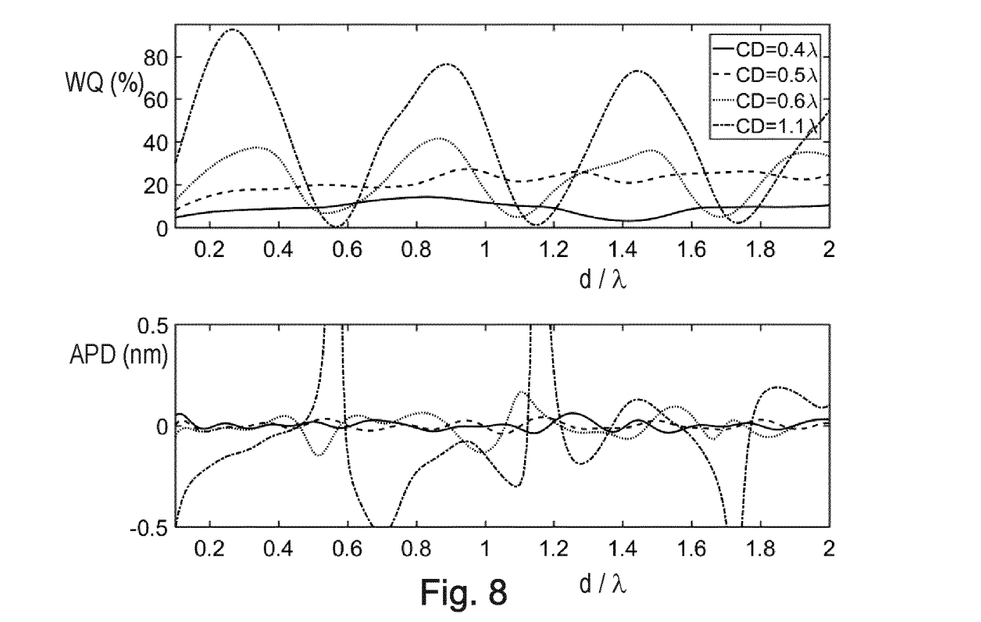
FIG. 8 depicts Wafer Quality (WQ) and Alignment Position Deviation (APD) as a function of alignment mark depth in the presence of 1 nm Floor Tilt asymmetry for each of the four different critical dimensions shown in FIG. 7.

FIG. 8 depicts Wafer Quality (WQ) and Alignment Position Deviation (APD) as a function of alignment mark depth, d, (from 0.2λ-2λ) in the presence of 1 nm Floor Tilt asymmetry for each of the four different critical dimensions shown in FIG. 7. WQ is the alignment signal strength.

The following table of results can be obtained from FIG. 8.

This table shows that the mark is insensitive to mark depth over a wide margin of CD because (for a mark depth range of 0.2 lambda to 2 lambda) it leads to a small simulated APD variation for both cd=0.5λ and cd=0.4λ, in the case of a typical FT value of 1 nm.

Figure 9:
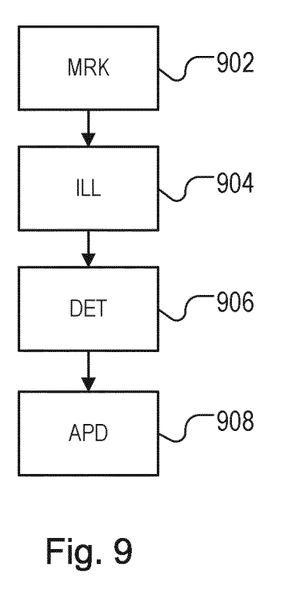
FIG. 9 is a flowchart of a method of alignment in accordance with an embodiment of the present invention.

FIG. 9 is a flowchart of a method of alignment in accordance with an embodiment of the present invention. The method of alignment has the following steps.

902 (MRK): Providing an alignment mark formed on a planar substrate.

904 (ILL): Illuminating the alignment mark with radiation of the predetermined wavelength.

906 (DET): Detecting the radiation scattered by the alignment mark arising from the illumination.

908 (APD): Determining a position of the alignment mark (APD) using the detected radiation.

The alignment mark has a periodic structure configured to scatter radiation incident on the alignment mark. The scattering is mainly by coupling of the incident radiation to a waveguiding mode in the periodic structure.

Figure 10:
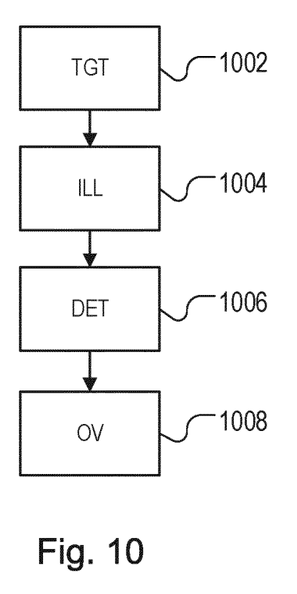
FIG. 10 is a flowchart of a method of overlay error measurement in accordance with an embodiment of the present invention.

FIG. 10 is a flowchart of a method of overlay error measurement in accordance with an embodiment of the present invention. The method of determining an overlay error has the following steps.

1002 (TGT): Providing an overlay target formed on a planar substrate. The overlay target has a lower mark overlaid with an upper mark having a pitch the same as the lower mark. The lower mark has a periodic structure configured to scatter radiation incident on a surface plane of the lower mark. The surface plane is parallel to the substrate's plane. The scattering is mainly by coupling of the incident radiation to a waveguiding mode. The upper mark has a periodic structure configured to scatter radiation of the predetermined wavelength without scattering mainly by coupling of the incident radiation to a waveguiding mode in its periodic structure.

1004 (ILL): Illuminating the overlay target with radiation of the predetermined wavelength.

1006 (DET): Detecting the radiation scattered by the overlay target arising from the illumination.

1008 (OV): Determining an overlay error OV between the upper and lower marks using the detected radiation.

With reference to FIGS. 9 and 10, the periodic structure has a repeated unit cell divided into adjacent first and second portions along a direction of periodicity. The first portion has a first effective refractive index and a first length along the direction of periodicity. The second portion having a second effective refractive index, which is lower over its optical path compared to the first effective refractive index, and a second length along the direction of periodicity. The effective refractive indexes and lengths of the portions are configured to provide an optical path length of the unit cell in the direction of periodicity that equals an integer multiple of a wavelength present in the spectrum of the radiation. The effective refractive indexes and lengths of the portions are

|  | s-pol (0.2λ~2λ) | | | | |
| --- | --- | --- | --- | --- | --- |
|  | cd = 0.4λ | cd = 0.5λ | cd = 0.6λ | cd = 1.1λ | STD |
| WQ | 2.96~14.17 | 15~27.3 | 4.7~41.5 | 0~92.5 | 0~90 |
|  | [Δ 11.21] | [Δ 12.3] | [Δ 36.8] | [Δ 92.5] | [Δ 90] |
| APD [nm] | −0.037~0.061 | −0.041~0.042 | −0.154~0.165 | −0.84~7.3 | −19~16 |
|  | [Δ 0.098] | [Δ 0.082] | [Δ 28] | [Δ 8.14] | [Δ 35] | configured to provide an optical path length of the second portion in the direction of periodicity that is preferably equal to from 0.30 to 0.49 (more preferably from 0.35 to 0.45) of the wavelength present in the spectrum of the radiation.

Embodiments of the present invention have several advantages over a wider design rule margin compared to the disclosure of WO2019081091A1.

The alignment and overlay measurement methods are less complex; only one single wavelength is needed for alignment purposes, since WQ and APD do not vary as a function of the mark depth, for GMM, over a wider margin.

The alignment and overlay measurement methods are more accurate; in the case of process-induced asymmetry, especially for FT, the APD obtained for GMM is extremely small; for a typical value of FT=1 nm, the APD is smaller than 0.5 Angstrom, over a wider margin.

The alignment and overlay measurement methods are faster, especially in the case of tunable light sources that can provide only one color at a time, over a wider margin.

The marks and targets may be used in golden reference wafers for wafer-to-wafer error correction, since they are insensitive to asymmetry, over a wider margin.

There is an improvement in Copper Dual Damascene type structures; the presence of layers below the GMM mark has a limited impact on the signal, therefore allowing a more robust APD or OV readout, over a wider margin.

Similar to as described with reference to FIG. 17 of WO2019081091A1, GMM can be used as the bottom grating of the overlay target, to reduce the effect of layers underneath the mark that affect the overlay readout signal, over a wider margin.

Furthermore, embodiments of the present invention are compatible with smaller marks, over a wider margin.

Embodiments provide sub-angstrom APD for FT=1 nm

Embodiments provide sub-nanometer APD for SWA=1 degree for a realistic mark depth range[0.1-1 lambda]

Embodiments are insensitive to mark depth, (for example having APD variation of ~0.08 nm for FT and ~0.4 nm for SWA), so facilitate higher etching/polishing/deposition tolerances of lithographic processing tools.

Further embodiments provide methods of configuring marks used in alignment and/or overlay measurements, for example applied to a process of designing marks. The designing/configuring of the mark is targeted to obtain (after providing the mark to a substrate) the desired excitation of the waveguiding mode when illuminated by radiation having a certain wavelength. In a first step the mark is configured using a computer program and a computer system suitable to provide designing of the mark such that the mark obeys the design rules associated with the desired excitation of the waveguide mode. In a second step a patterning device is manufactured comprising at least a mark compatible with said design rules. In a third step a (planar) substrate is provided with the mark by exposing the patterning device obtained by the manufacturing to the planar substrate using any suitable lithographic process. Typically the patterning device is then loaded into a lithographic apparatus, the planar substrate is provided with a photosensitive layer (resist coating) and subsequently loaded into the lithographic apparatus. After exposing the patterning device to the coated planar substrate and developing the resist the mark is provided to the substrate. Subsequently an etching process may be applied to etch the mark pattern into the planar substrate material.

Further a metrology system may be configured to perform the methods of alignment and/or overlay measurement as depicted in FIGS. 9 and 10. The metrology system may be an alignment or overlay measurement system within a lithographic apparatus or a metrology tool (such as an integrated or standalone scatterometer tool). The metrology system is configured to provide radiation at a wavelength suitable to excite the waveguiding mode associated with the marks provided to the planar substrate.

Further embodiments are disclosed in the list of numbered clauses below:

1. A method for performing an alignment or overlay measurement on a mark comprising a periodic structure, the mark formed on or in a planar substrate, the method comprising:

illuminating the mark with radiation having a predetermined wavelength;

detecting radiation scattered by the mark arising from the illumination; and determining a position or overlay value using the detected radiation, characterized in that the predetermined wavelength and periodic structure are configured to provide scattering of the radiation by excitation of a waveguiding mode in the periodic structure parallel to the surface plane of the planar substrate.

2. The method of clause 1, wherein the periodic structure has a repeated unit cell divided into adjacent first and second portions along a direction of periodicity, wherein:

a first portion has a first effective refractive index and a first length along the direction of periodicity;

a second portion has a second effective refractive index, which is lower over its optical path compared to the first effective refractive index, and a second length along the direction of periodicity;

an optical path length of the unit cell in the direction of periodicity equals or approximates an integer multiple of the predetermined wavelength; and an optical path length of the second portion in the direction of periodicity lies within a range of 0.35 to 0.45 of the predetermined wavelength.

3. The method of clause 1 or 2, wherein the detecting comprises: a) filtering of the radiation scattered by the mark to select only scattered radiation of a wavelength close to or equal to the predetermined wavelength, and b) detecting the filtered radiation.

4. The method of any preceding clause, wherein the mark is a lower mark of an overlay mark, the overlay mark being composed of the lower mark overlaid with an upper mark having the same pitch as the lower mark.

5. A method of alignment comprising the steps:

providing an alignment mark formed on or in a planar substrate, the mark comprising a periodic structure, wherein the periodic structure has a repeated unit cell divided into adjacent first and second portions along a direction of periodicity, the first portion having a first effective refractive index and a first length along the direction of periodicity, the second portion having a second effective refractive index, which is lower over its optical path compared to the first effective refractive index, and a second length along the direction of periodicity;

illuminating the alignment mark with radiation having a predetermined wavelength, wherein the effective refractive indexes and lengths of the portions of the alignment mark are configured to provide: a) an optical path length of the unit cell in the direction of periodicity that equals an integer multiple of the predetermined wavelength, and b) an optical path length of the second portion in the direction of periodicity of 0.35 to 0.45 of the predetermined wavelength, such that scattering occurs mainly by excitation of a waveguiding mode in the periodic structure;

detecting radiation scattered by the alignment mark arising from the illumination; and determining a position of the alignment mark using the detected radiation.

6. A method of alignment, comprising the steps:

providing an alignment mark formed on or in a planar substrate, the mark comprising a periodic structure, wherein the periodic structure has a repeated unit cell divided into adjacent first and second portions along a direction of periodicity, the first portion having a first effective refractive index and a first length along the direction of periodicity, the second portion having a second effective refractive index, which is lower over its optical path compared to the first effective refractive index, and a second length along the direction of periodicity;

illuminating the alignment mark with broadband radiation comprising a predetermined wavelength, wherein the effective refractive indexes and lengths of the portions of the alignment mark are configured to provide: a) an optical path length of the unit cell in the direction of periodicity that equals an integer multiple of the predetermined wavelength, and b) an optical path length of the second portion in the direction of periodicity that is from 0.35 to 0.45 of the predetermined wavelength, such that scattering of the predetermined wavelength occurs mainly by excitation of a waveguiding mode in the periodic structure;

filtering the radiation scattered by the alignment mark arising from the illumination to select the wavelength corresponding to excitation of the waveguiding mode in the periodic structure parallel to the surface plane;

detecting the filtered radiation; and determining a position of the alignment mark using the detected radiation.

7. A method of overlay measurement, the method comprising:

providing an overlay mark formed on or in a planar substrate, the overlay mark comprising a lower mark overlaid with an upper mark having the same pitch as the lower mark, the lower mark comprising a periodic structure, wherein the periodic structure has a repeated unit cell divided into adjacent first and second portions along a direction of periodicity, the first portion having a first effective refractive index and a first length along the direction of periodicity, the second portion having a second effective refractive index, which is lower over its optical path compared to the first effective refractive index, and a second length along the direction of periodicity;

illuminating the overlay mark with radiation having a predetermined wavelength, wherein the effective refractive indexes and lengths of the portions of the lower mark are configured to provide: a) an optical path length of the unit cell in the direction of periodicity that equals an integer multiple of the predetermined wavelength, and b) an optical path length of the second portion in the direction of periodicity that is within a range of 0.35 to 0.45 of the predetermined wavelength, such that scattering occurs mainly by excitation of a waveguiding mode in the periodic structure;

detecting the radiation scattered by the overlay mark arising from the illumination; and determining overlay at the position of the overlay mark using the detected radiation.

8. A method of configuring a mark on or in a planar substrate having a periodic structure configured to scatter radiation incident on the mark while being subject to an alignment or overlay measurement on the planar substrate, the method comprising:

obtaining a wavelength of the radiation incident on the mark; and configuring the periodic structure based on the occurrence of coupling of the incident radiation to a waveguiding mode of the periodic structure parallel to the surface plane of the planar substrate.

9. The method of clause 8, wherein:

the periodic structure has a repeated unit cell divided into adjacent first and second portions along a direction of periodicity, wherein the first portion has a first effective refractive index and a first length along the direction of periodicity and the second portion has a second effective refractive index, which is lower over its optical path compared to the first effective refractive index, and a second length along the direction of periodicity; and the configuring of the periodic structure is based on arranging that: a) an optical path length of the unit cell in the direction of periodicity equals an integer multiple of the wavelength, and b) an optical path length of the second portion in the direction of periodicity lies within a range from 0.30 to 0.45 of the wavelength.

10. A method for manufacturing a patterning device used in providing a mark comprising a periodic structure to a planar substrate, the method comprising:

obtaining a wavelength of radiation used in illuminating the planar substrate while being subject to an alignment or overlay measurement;

configuring the periodic structure such that when provided to the planar substrate it provides:

a) scattering of incident radiation while being subject to the alignment or overlay measurement; and b) coupling of the incident radiation at the wavelength to a waveguiding mode of the periodic structure parallel to the surface plane of the substrate; and providing the configured mark to the patterning device during a process of manufacturing of the patterning device.

11. A method for providing a planar substrate with a mark having a periodic structure configured to scatter radiation incident on the mark while being subject to an alignment or overlay measurement, the method comprising:

obtaining a patterning device manufactured according to the method of clause 10;

obtaining the planar substrate; and using the patterning device and the planar substrate in a lithographic process to provide the mark to the planar substrate.

12. A metrology system configured to perform the method of any of clauses 1 to 7.

13. A lithographic apparatus or metrology tool comprising the metrology system of clause 12.

14. A computer program comprising instructions to perform the method of any of clauses 1 to 11.

15. A computer system configured to execute the computer program of clause 14.

16. A mark formed on a planar substrate, the mark comprising a periodic structure configured to scatter radiation incident on the alignment mark, the scattering mainly by coupling of the incident radiation to a waveguiding mode in the periodic structure, wherein the periodic structure has a repeated unit cell divided into adjacent first and second portions along a direction of periodicity, the first portion having a first effective refractive index and a first length along the direction of periodicity, the second portion having a second effective refractive index, which is lower over its optical path compared to the first effective refractive index, and a second length along the direction of periodicity, wherein the effective refractive indexes and lengths of the portions are configured to provide:
1) an optical path length of the unit cell in the direction of periodicity that equals an integer multiple of a wavelength present in the spectrum of the radiation and
2) an optical path length of the second portion in the direction of periodicity that is from 0.30 to 0.49 of the wavelength present in the spectrum of the radiation.

17. The mark of clause 16, wherein the effective refractive indexes and lengths of the portions are configured to provide the optical path length of the second portion in the direction of periodicity that is from 0.35 to 0.45 of the wavelength present in the spectrum of the radiation.

18. A substrate comprising the mark of clause 16 or clause 17.

19. An overlay target comprising a lower mark in accordance with clause 16 or clause 17, overlaid with an upper mark having a pitch the same as the lower mark and comprising a periodic structure configured to scatter radiation without scattering mainly by coupling of the incident radiation to a waveguiding mode in its periodic structure.

20. A substrate comprising the overlay target of clause 19.

21. A method of alignment comprising the steps:
providing an alignment mark formed on a planar substrate, in accordance with the mark of clause 16 or clause 17;
illuminating the alignment mark with radiation;
detecting the radiation scattered by the alignment mark arising from the illumination; and
determining a position of the alignment mark using the detected radiation.

22. A method of determining an overlay error comprising the steps:
providing an overlay target formed on a planar substrate, the overlay target comprising a lower mark overlaid with an upper mark having a pitch the same as the lower mark, wherein:
the lower mark comprises a mark in accordance with clause 16 or clause 17; and
the upper mark comprises a periodic structure configured to scatter radiation without scattering mainly by coupling of the incident radiation to a waveguiding mode in its periodic structure;
illuminating the overlay target with radiation;
detecting radiation scattered by the overlay target arising from the illumination; and determining an overlay error between the upper and lower marks using the detected radiation.

Although specific reference may be made in this text to the use of lithographic apparatus in the manufacture of ICs, it should be understood that the lithographic apparatus described herein may have other applications, such as the processing of substrates in the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "field"/"die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. In addition, it should be appreciated that structural features or method steps shown or described in any one embodiment herein can be used in other embodiments as well.

The invention claimed is:

1. A method of alignment, the method comprising:
providing an alignment mark formed on or in a planar substrate, the mark comprising a periodic structure, wherein the periodic structure has a repeated unit cell divided into adjacent first and second portions along a direction of periodicity, the first portion having a first effective refractive index and a first length along the direction of periodicity, and the second portion having a second effective refractive index, which is lower over its optical path compared to the first effective refractive index, and a second length along the direction of periodicity;
illuminating the alignment mark with radiation having a predetermined wavelength, wherein the effective refractive indexes and lengths of the portions of the alignment mark are configured to provide: a) an optical path length of the unit cell in the direction of periodicity that essentially equals an integer multiple of the predetermined wavelength, and b) an optical path length of the second portion in the direction of periodicity that is selected from 0.35 to 0.45 of the predetermined wavelength, such that scattering occurs mainly by excitation of a waveguiding mode in the periodic structure;

detecting radiation scattered by the alignment mark arising from the illumination; and determining a position of the alignment mark using the detected radiation.

2. A metrology system configured to perform the method of claim 1.

3. A lithographic apparatus or metrology tool comprising the metrology system of claim 2.

4. The method of claim 1, wherein the radiation comprises broadband radiation comprising the predetermined wavelength, further comprising filtering the radiation scattered by the alignment mark arising from the illumination to select the wavelength corresponding to excitation of the waveguiding mode in the periodic structure parallel to the surface plane, and wherein the detecting radiation comprises detecting the filtered radiation.

5. A non-transitory computer-readable medium comprising instructions therein, the instructions, when executed by a computer system, configured to cause the computer system to cause performance of the method of claim 1.

6. A method of overlay measurement, the method comprising:

providing an overlay mark formed on or in a planar substrate, the overlay mark comprising a lower mark overlaid with an upper mark having essentially the same pitch as the lower mark, the lower mark comprising a periodic structure, wherein the periodic structure has a repeated unit cell divided into adjacent first and second portions along a direction of periodicity, the first portion having a first effective refractive index and a first length along the direction of periodicity, and the second portion having a second effective refractive index, which is lower over its optical path compared to the first effective refractive index, and a second length along the direction of periodicity;

illuminating the overlay mark with radiation having a predetermined wavelength, wherein the effective refractive indexes and lengths of the portions of the lower mark are configured to provide: a) an optical path length of the unit cell in the direction of periodicity that essentially equals an integer multiple of the predetermined wavelength, and b) an optical path length of the second portion in the direction of periodicity that is selected from 0.35 to 0.45 of the predetermined wavelength, such that scattering occurs mainly by excitation of a waveguiding mode in the periodic structure;

detecting the radiation scattered by the overlay mark arising from the illumination; and determining overlay at the position of the overlay mark using the detected radiation.

7. A non-transitory computer-readable medium comprising instructions therein, the instructions, when executed by a computer system, configured to cause the computer system to cause performance of the method of claim 6.

8. A method of configuring a mark on or in a planar substrate having a periodic structure configured to scatter radiation incident on the mark while being subject to an alignment or overlay measurement on the planar substrate, the method comprising:

obtaining a wavelength of the radiation incident on the mark; and configuring the periodic structure based on the excitation of a waveguiding mode of the periodic structure parallel to the surface plane of the planar substrate when illuminated by the incident radiation at the wavelength.

9. The method of claim 8, wherein:

the periodic structure has a repeated unit cell divided into adjacent first and second portions along a direction of periodicity, wherein the first portion has a first effective refractive index and a first length along the direction of periodicity and the second portion has a second effective refractive index, which is lower over its optical path compared to the first effective refractive index, and a second length along the direction of periodicity; and the configuring of the periodic structure is based on arranging that: a) an optical path length of the unit cell in the direction of periodicity essentially equals an integer multiple of the wavelength, and b) an optical path length of the second portion in the direction of periodicity lies within a range from 0.30 to 0.45 of the wavelength.

10. A non-transitory computer-readable medium comprising instructions therein, the instructions, when executed by a computer system, configured to cause the computer system to cause performance of the method of claim 8.

11. A method for manufacturing a patterning device used in providing a mark comprising a periodic structure to a planar substrate, the method comprising:

obtaining a wavelength of radiation used in illuminating the planar substrate while being subject to an alignment or overlay measurement;

configuring the periodic structure such that when provided to the planar substrate it provides: a) scattering of incident radiation while being subject to the alignment or overlay measurement, and b) coupling of the incident radiation at the wavelength to a waveguiding mode of the periodic structure parallel to the surface plane of the substrate; and providing the configured mark to the patterning device during a process of manufacturing of the patterning device.

12. A method for providing a planar substrate with a mark having a periodic structure configured to scatter radiation incident on the mark while being subject to an alignment or overlay measurement, the method comprising:

obtaining a patterning device manufactured according to the method of claim 11;

obtaining the planar substrate; and using the patterning device and the planar substrate in a lithographic process to provide the mark to the planar substrate.

13. A non-transitory computer-readable medium comprising instructions therein, the instructions, when executed by a computer system, configured to cause the computer system to cause performance of the method of claim 11.

* * * * *